(12) United States Patent
Jacobsen et al.

(10) Patent No.: US 9,116,428 B1
(45) Date of Patent: Aug. 25, 2015

(54) MICRO-TRUSS BASED ENERGY ABSORPTION APPARATUS

(75) Inventors: Alan J. Jacobsen, Santa Monica, CA (US); William B. Carter, Santa Monica, CA (US); Robert W. Cumberland, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 1412 days.

(21) Appl. No.: 12/455,449

(22) Filed: Jun. 1, 2009

(51) Int. Cl.
*G03F 7/09* (2006.01)
*B32B 3/12* (2006.01)
*F41H 5/04* (2006.01)

(52) U.S. Cl.
CPC ... *G03F 7/09* (2013.01); *B32B 3/12* (2013.01); *F41H 5/04* (2013.01)

(58) Field of Classification Search
CPC ............... G03G 7/09; F41H 5/04; B32B 3/12
USPC .............................. 89/36.02; 385/46; 428/116
See application file for complete search history.

(56) References Cited

U.S. PATENT DOCUMENTS

| 6,698,331 | B1 | 3/2004 | Yu et al. | |
| 7,128,963 | B2 | 10/2006 | Benitsch | |
| 7,288,326 | B2 * | 10/2007 | Elzey et al. | 428/593 |
| 7,653,276 | B1 * | 1/2010 | Gross et al. | 385/46 |
| 7,687,132 | B1 * | 3/2010 | Gross et al. | 428/116 |
| 2005/0154567 | A1 * | 7/2005 | Jackman et al. | 703/2 |
| 2010/0159303 | A1 * | 6/2010 | Rock et al. | 429/34 |
| 2010/0291466 | A1 * | 11/2010 | Rock et al. | 429/483 |

* cited by examiner

*Primary Examiner* — Stephen M Johnson
(74) *Attorney, Agent, or Firm* — Christie, Parker & Hale, LLP

(57) ABSTRACT

A micro-truss based blast protection apparatus. In one embodiment, the blast protection apparatus includes a three-dimensional (3D) ordered truss core between a first face plate and a second face plate. The 3D ordered truss core includes first truss elements defined by first self-propagating polymer waveguides and extending along a first direction, second truss elements defined by second self-propagating polymer waveguides and extending along a second direction, and third truss elements defined by third self-propagating polymer waveguides and extending along a third direction. The first, second, and third truss elements interpenetrate each other at a plurality of nodes to form a continuous material. The first, second, and third truss elements define an open space for providing a densification in response to a force applied to the first face plate and/or the second face plate, and the 3D ordered truss core is self-supporting.

24 Claims, 14 Drawing Sheets
(2 of 14 Drawing Sheet(s) Filed in Color)

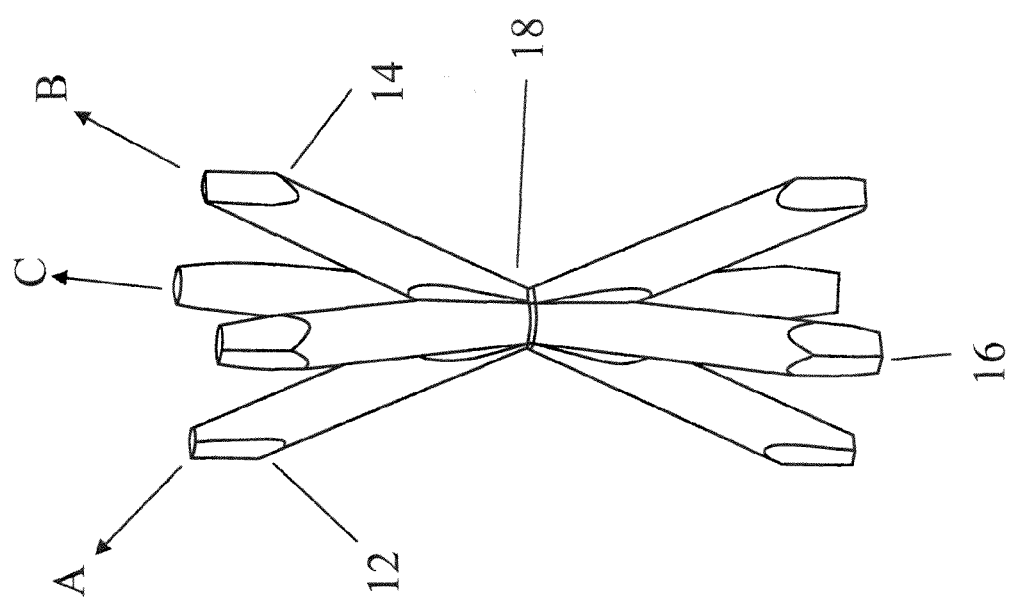
FIG. 1
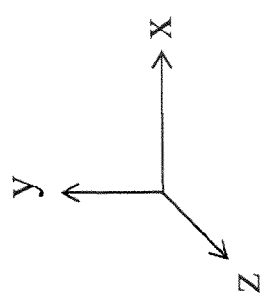

MICRO-TRUSS BASED ENERGY ABSORPTION APPARATUS

FIELD OF THE INVENTION

The present invention relates to a micro-truss based structural apparatus intended to absorb energy from impacts or pressure waves created by blasts (e.g., a micro-truss based blast protection apparatus).

BACKGROUND OF THE INVENTION

Cellular, or porous, materials have the ability to absorb significantly more energy than solid structures because of their ability for densification in response to impacts. As such, cellular materials such as metallic or ceramic foams have been proposed as an energy absorbing layer in armor-type systems; however, the random microstructure of these materials severely diminishes their mechanical properties. The deformation of a cellular foam is dominated by the bending behavior of the cell struts. Simple mechanics dictates that bending dominated structures are less efficient in load carrying capacity than compression dominated behavior exemplified by a truss structure.

U.S. Pat. Nos. 6,698,331 and 7,128,963, which are incorporated by reference herein in their entirety, propose blast protection material systems that incorporate random cellular ceramic or metallic foam as an energy absorbing layer. However, these patent disclosures do not provide an ordered micro-truss structure. The use of metallic lattice (truss) materials for energy absorbing application is discussed in U.S. Pat. No. 7,382,959 and U.S. patent application Ser. Nos. 11/801,908 (now U.S. Pat. No. 8,197,930); 12/008,479 (now U.S. Pat. No. 8,320,727); 12/074,727 (now U.S. Pat. No. 7,687,132) and 12/075,033 (now U.S. Pat. No. 7,653,276), which are incorporated by reference herein in their entirety. However, there is still a need to provide an impact or blast energy absorbing material able to support a load, be lightweight, structurally stiff and allow controlled, predictable failure points. The above information disclosed in this Background section is only for enhancement of understanding of the background of the invention and therefore it may contain information that does not form the prior art that is already known in this country to a person skilled in the art

SUMMARY OF THE INVENTION

Aspects of embodiments of the present invention are directed toward a micro-truss based structural apparatus intended to absorb energy from an impact or a pressure wave (e.g., a micro-truss based blast protection apparatus). In embodiments of the present invention, polymer micro-truss structures, which are formed by interconnecting self-propagating polymer waveguides, are converted to lightweight, high-strength materials such as carbon, metals, ceramics, or composites thereof, that are utilized by the micro-truss based protection apparatuses for high velocity impact applications. These unique truss microstructures provide lightweight structural functionalities, and the porous nature of the utilized material provides room for significant densification.

Aspects of embodiments of the present invention are directed toward micro-truss based blast protection apparatuses that utilize micro-truss materials as both a structural and an energy absorbing layer. Cellular, or porous, materials have the ability to absorb significantly more energy than solid structures because of their ability for densification in response to forces applied thereto. Cellular materials such as metallic or ceramic foams have been proposed as an energy absorbing layer in armor-type systems; however, the random microstructure of these materials severely diminishes their mechanical properties. When compared with random porous structures, the long range ordered structure of the micro-truss materials greatly improves strength per unit weight. This increase in specific strength will allow for structures with the same strength as random porous materials with less weight and greater open volumes, thus increasing their ability to densify and therefore providing improved blast protection.

More specifically, in one embodiment of the present invention, a micro-truss based structural apparatus intended to absorb energy from an impact or pressure wave includes a first face plate, a second face plate, and a three-dimensional ordered truss core between the first face plate and the second face plate. Here, the three-dimensional ordered truss core includes a plurality of first truss elements defined by a plurality of first self-propagating polymer waveguides and extending along a first direction, a plurality of second truss elements defined by a plurality of second self-propagating polymer waveguides and extending along a second direction, and a plurality of third truss elements defined by a plurality of third self-propagating polymer waveguides and extending along a third direction. The first, second, and third truss elements interpenetrate each other at a plurality of nodes to form a continuous material. The first, second, and third truss elements define an open space for providing a densification in response to a force applied to at least one of the first face plate or the second face plate, and the three-dimensional ordered truss core is self-supporting.

In one embodiment, each of the first, second, and third truss elements has a truss diameter between about 10 microns and about 5 mm and has a length between two adjacent ones of the nodes that is between about 5 and 15 times the truss diameter. Also, the first three-dimensional ordered truss core may have between about ½ unit cell of the three-dimensional ordered truss core and about 5 unit cells of the three-dimensional ordered truss core through its thickness.

In one embodiment, the micro-truss based structural apparatus intended to absorb energy from an impact or pressure wave further includes a second three-dimensional ordered truss core. Here, the second plate is between the three-dimensional ordered truss core and the second three-dimensional ordered truss core. The second three-dimensional ordered truss core includes a plurality of fourth truss elements defined by a plurality of fourth self-propagating polymer waveguides and extending along a fourth direction, a plurality of fifth truss elements defined by a plurality of fifth self-propagating polymer waveguides and extending along a fifth direction, and a plurality of sixth truss elements defined by a plurality of sixth self-propagating polymer waveguides and extending along a sixth direction. The fourth, fifth, and sixth truss elements interpenetrate each other at a plurality of second nodes to form a second continuous material. The fourth, fifth, and sixth truss elements define a second open space for providing a second densification in response to a force applied thereto, and the second three-dimensional ordered truss core is self-supporting.

In one embodiment, the three-dimensional ordered truss core has a first three-dimensional pattern, and the second three-dimensional ordered truss core has a second three-dimensional pattern differing from the first three-dimensional pattern.

In one embodiment, the micro-truss based structural apparatus intended to absorb energy from an impact or pressure wave further includes a third three-dimensional ordered truss core. Here, the second three-dimensional ordered truss core is between the second face plate and the third three-dimensional ordered truss core. The third three-dimensional ordered truss core includes a plurality of seventh truss elements defined by a plurality of seventh self-propagating polymer waveguides and extending along a seventh direction, a plurality of eighth truss elements defined by a plurality of eighth self-propagating polymer waveguides and extending along an eighth direction, and a plurality of ninth truss elements defined by a plurality of ninth self-propagating polymer waveguides and extending along a ninth direction. The seventh, eighth, and ninth truss elements interpenetrate each other at a plurality of third nodes to form a third continuous material. The seventh, eighth, and ninth truss elements define a third open space for providing a third densification in response to a force applied thereto, and the third three-dimensional ordered truss core is self-supporting.

In one embodiment, the three-dimensional ordered truss core has a first three-dimensional pattern, the second three-dimensional ordered truss core has a second three-dimensional pattern differing from the first three-dimensional pattern, and the third three-dimensional ordered truss core has a third three-dimensional pattern differing from the first three-dimensional pattern and/or the second three-dimensional pattern.

In one embodiment, the first, second, and third truss elements are adapted to provide the three-dimensional ordered truss core with a axial-dominated deformation behavior of the truss members under a compression force applied to the three-dimensional ordered truss core.

In one embodiment, the first, second, and third truss elements are adapted to provide the three-dimensional ordered truss core with a compressive elastic modulus directly proportional to both a density of the three-dimensional ordered truss core and a modulus of a solid material portion of the three-dimensional ordered truss core.

In one embodiment, the first, second, and third truss elements are adapted to provide the three-dimensional ordered truss core with a compressive elastic modulus (E) determined below:

$$E = C_E E_s (\rho/\rho_s)^r$$

where $\rho$ is a density of the three-dimensional ordered truss core, $\rho_s$ is a density of a solid material portion of the three-dimensional ordered truss core, $E_s$ is a modulus of the solid material portion of the three-dimensional ordered truss core, and $C_E$ and r are scaling parameters related to the three-dimensional ordered truss core (e.g., an angle of at least one of the first, second and third truss elements relative to the at least one of the first face plate or the second face plate).

In one embodiment, the open space of the three-dimensional ordered truss core is not less than about 40% by volume of the three-dimensional ordered truss core and not greater than about 99% by volume of the three-dimensional ordered truss core.

In one embodiment, the open space of the three-dimensional ordered truss core is not less than about 70% by volume of the three-dimensional ordered truss core and not greater than about 95% by volume of the three-dimensional ordered truss core.

In one embodiment, the three-dimensional ordered truss core includes a material selected from the group consisting of vitreous carbon, silicon carbide, titanium-nitride, niobium, nickel, diamond, carbon fibers, nanofibers, nanotubes, tungsten carbide, rhenium diboride, and combinations thereof.

In one embodiment, the three-dimensional ordered truss core is a vitreous carbon three-dimensional ordered truss core.

In one embodiment, the micro-truss based structural apparatus intended to absorb energy from an impact or pressure wave further includes one or more ductile material layers coated on a surface of at least one truss element of the first truss elements, the second truss elements, or the third truss elements. The one or more ductile material layers may include niobium, titanium, aluminum, and alloys thereof. In addition, the one or more ductile material layers may occupy from about 5 to about 15% of solid volume fraction of the three-dimensional ordered truss core.

According to another embodiment of the present invention, a micro-truss based structural apparatus intended to absorb energy from an impact or pressure wave includes a micro-scale truss hierarchical structure and a macro-scale truss hierarchical structure composed of the micro-scale truss hierarchical structure. In one embodiment, the macro-scale truss hierarchical structure includes a plurality of macro-scale truss elements. The micro-scale truss hierarchical structure includes a plurality of micro-scale truss elements, and the plurality of macro-scale truss elements are composed of the plurality of micro-scale truss elements. The plurality of micro-scale truss elements of the micro-scale truss hierarchical structure include a plurality of first truss elements defined by a plurality of first self-propagating polymer waveguides and extending along a first direction, a plurality of second truss elements defined by a plurality of second self-propagating polymer waveguides and extending along a second direction, and a plurality of third truss elements defined by a plurality of third self-propagating polymer waveguides and extending along a third direction. The first, second, and third truss elements interpenetrate each other at a plurality of nodes to form a continuous material. The first, second, and third truss elements define an open space for providing a densification in response to a force applied thereto, and the micro-scale truss hierarchical structure is self-supporting.

In one embodiment, the plurality of macro-scale truss elements of the macro-scale truss hierarchical structure define a second open space for providing a second densification in response to a force applied thereto.

In one embodiment, the micro-truss based structural apparatus intended to absorb energy from an impact or pressure wave also includes a first face plate and a second face plate, and the plurality of micro-scale truss elements of the micro-scale truss hierarchical structure are between the first face plate and the second face plate.

In one embodiment, the plurality of macro-scale truss elements are configured to be a plurality of hexagonal cores.

In one embodiment, the plurality of macro-scale truss elements are configured to be a plurality of V-shaped structures. In one embodiment, the micro-truss based structural apparatus intended to absorb energy from an impact or pressure wave further includes a third face plate and a fourth face plate. Here, the V-shaped structures formed by the macro-scale truss elements are between the third face plate and the fourth face plate.

According to another embodiment of the present invention, a micro-truss based structural apparatus intended to absorb energy from an impact or pressure wave includes a hierarchical structure. The hierarchical structure includes a smaller scale micro-truss filling the open volume of a larger-scale micro-truss, the smaller scale micro-truss being defined by a plurality of first self-propagating photopolymer waveguides and the larger scale micro-truss being defined by a plurality of second self-propagating photopolymer waveguides.

According to another embodiment of the present invention, a method of absorbing an energy is provided. The method includes: positioning a first three-dimensional ordered truss core between a first face plate and a second face plate, the first three-dimensional ordered truss core including: a plurality of first truss elements defined by a plurality of first self-propagating polymer waveguides and extending along a first direction; a plurality of second truss elements defined by a plurality of second self-propagating polymer waveguides and extending along a second direction; and a plurality of third truss elements defined by a plurality of third self-propagating polymer waveguides and extending along a third direction, wherein the first, second, and third truss elements interpenetrate each other at a plurality of first nodes to form a first continuous material, and wherein the first, second, and third truss elements define a first open space; positioning at least one of the first face plate or the second face plate to allow the energy to impact the at least one of the first face plate or the second face plate; and absorbing the energy by densifying the first three-dimensional ordered truss core through collapsing of the first open space.

In one embodiment, the method further includes: positioning the second plate between the first three-dimensional ordered truss core and a second three-dimensional ordered truss core, the second three-dimensional ordered truss core including: a plurality of fourth truss elements defined by a plurality of fourth self-propagating polymer waveguides and extending along a fourth direction; a plurality of fifth truss elements defined by a plurality of fifth self-propagating polymer waveguides and extending along a fifth direction; and a plurality of sixth truss elements defined by a plurality of sixth self-propagating polymer waveguides and extending along a sixth direction, wherein the fourth, fifth, and sixth truss elements interpenetrate each other at a plurality of second nodes to form a second continuous material, and wherein the fourth, fifth, and sixth truss elements define a second open space; and further absorbing the impact energy by densifying the second three-dimensional ordered truss core through collapsing of the second open space. In addition, the method may further include: positioning the second three-dimensional ordered truss core between the second face plate and a third three-dimensional ordered truss core, the third three-dimensional ordered truss core including: a plurality of seventh truss elements defined by a plurality of seventh self-propagating polymer waveguides and extending along a seventh direction; a plurality of eighth truss elements defined by a plurality of eighth self-propagating polymer waveguides and extending along an eighth direction; and a plurality of ninth truss elements defined by a plurality of ninth self-propagating polymer waveguides and extending along a ninth direction, wherein the seventh, eighth, and ninth truss elements interpenetrate each other at a plurality of third nodes to form a third continuous material, and wherein the seventh, eighth, and ninth truss elements define a third open space; and further absorbing the impact energy by densifying the third three-dimensional ordered truss core through collapsing of the third open space.

BRIEF DESCRIPTION OF THE DRAWINGS

The accompanying drawings, together with the specification, illustrate exemplary embodiments of the present invention, and, together with the description, serve to explain the principles of the present invention.

The patent or application file contains at least one drawing/picture executed in color. Copies of this patent or patent application publication with color drawing/picture(s) will be provided by the Office upon request and payment of the necessary fee.

FIG. 1 is a perspective schematic view of a portion of a structure according to an embodiment of the present invention.

FIG. 8b is a side schematic view of the hierarchical structure shown in FIG. 8a.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

In the context of embodiments of the present invention, a three-dimensional ordered microstructure is referred to as an ordered three-dimensional structure having order at the micrometer scale.

An embodiment of the present invention provides a micro-truss based structural apparatus intended to absorb energy from an impact or pressure wave (e.g., a micro-truss based blast protection apparatus). Another embodiment of the present invention provides a method and/or system of manufacturing the micro-truss based structural apparatus intended to absorb energy from an impact or pressure wave. In embodiments of the present invention, polymer micro-truss structures, which are formed by interconnecting self-propagating polymer waveguides, are converted to lightweight, high-strength materials such as carbon, metals, ceramics, or composites thereof, that are utilized by the micro-truss based protection apparatuses for high velocity impact applications. These unique truss microstructures provide lightweight structural functionalities, and the porous nature of the utilized material provides room for significant densification and increased energy absorption.

Embodiments of the present invention provide micro-truss based blast protection apparatuses that utilize micro-truss materials as both a structural and an energy absorbing layer. Cellular, or porous, materials have the ability to absorb significantly more energy than solid structures because of their ability for densification in response to impacts or pressure waves. Cellular materials such as metallic or ceramic foams have been proposed as an energy absorbing layer in armor-type systems; however, the random microstructure of these materials severely diminishes their mechanical properties. When compared with random porous structures, the long range ordered structure of the micro-truss materials greatly improves strength per unit weight. This increase in specific strength will allow for structures with the same strength as random porous materials with less weight and greater open volumes, thus increasing their ability to densify and therefore providing improved blast protection. Also, although metallic cellular materials with a truss architecture have been proposed to improve the mechanical efficiency of the porous layer, manufacturing limitations on the minimum thickness and feature size of these materials have limited their applicability.

Figure 2:
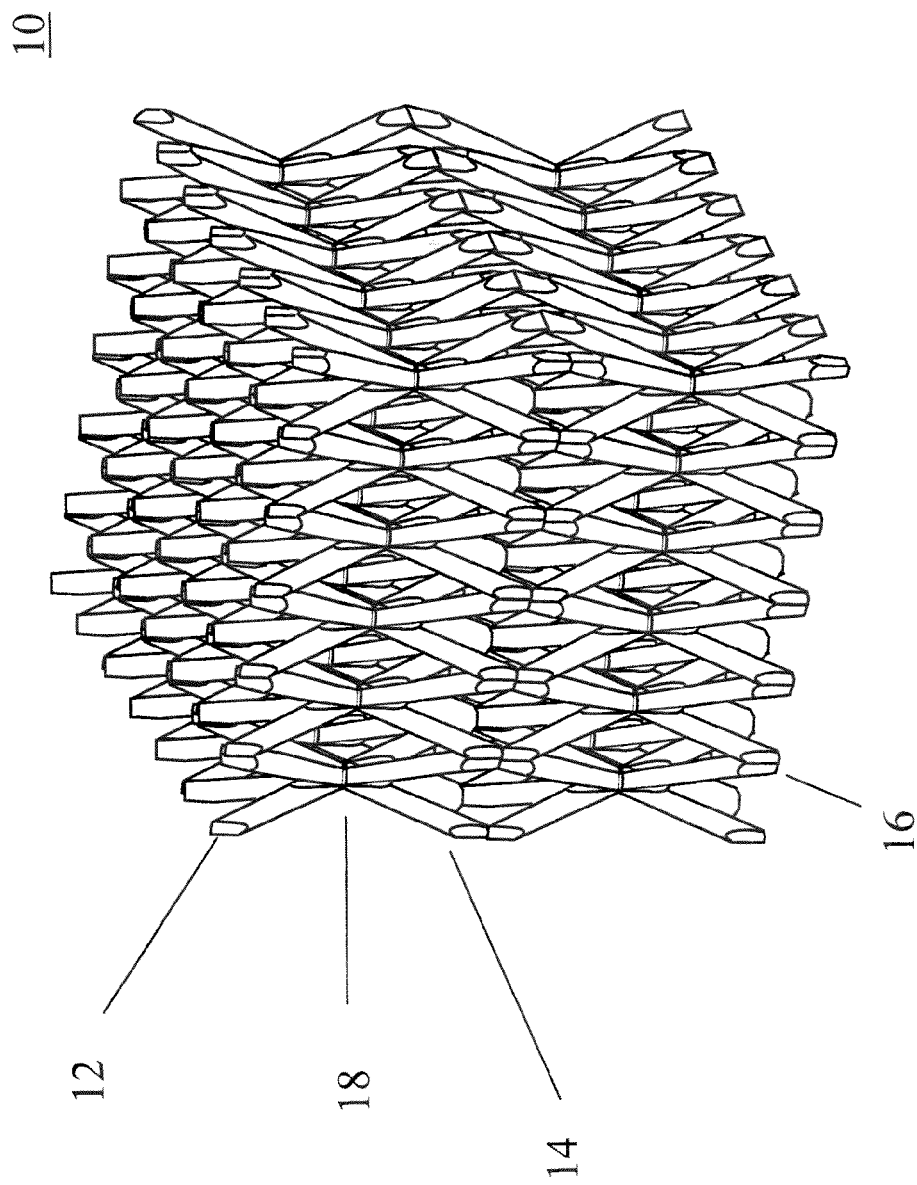
FIG. 2 is a perspective schematic view of a structure according to an embodiment of the present invention.

Referring to FIGS. 1 and 2, a three-dimensional ordered open-cellular microstructure 10 according to an embodiment of the present invention is a self-supporting structure. In one embodiment of the present invention, this three-dimensional ordered open-cellular microstructure 10 can be utilized or modified for use in a micro-truss based blast protection apparatus and/or to manufacture the micro-truss based blast protection apparatus. The microstructure 10 includes first truss elements 12, second truss elements 14, and third truss elements 16. The first truss elements 12 are defined by first self-propagating polymer waveguides and extend along a first direction A. The second truss elements 14 are defined by second self-propagating polymer waveguides and extend along a second direction B. The third truss elements 16 are defined by third self-propagating polymer waveguides and extend along a third direction C. With reference to FIGS. 1 and 2, the truss elements 12, 14, 16 interpenetrate each other at nodes 18 to form a continuous material with a three-dimensional microstructure order.

In one embodiment, the truss elements 12, 14, 16 include a photo-polymer material. In one embodiment, the truss elements 12, 14, 16 are polymer optical waveguide truss elements.

In one embodiment, the continuous material is continuously formed such that it lacks any interior boundaries, e.g., boundaries within the interpenetrating portions of truss elements 12, 14, 16. In another embodiment, each node 18 of the microstructure 10 is formed of the continuous material.

According to one embodiment of the present invention, the microstructure 10 is formed by using a fixed light input (collimated UV light) to cure (polymerize) polymer optical waveguides, which can self-propagate in a 3D pattern. As such, the propagated polymer optical waveguides form the microstructure 10.

As disclosed in Monro et al. "Topical Review Catching Light In Its Own Trap," Journal Of Modern Optics, 2001, Vol. 48, No. 2, 191-238, which is incorporated by reference herein in its entirety, some liquid polymers, referred to as photopolymers, undergo a refractive index change during the polymerization process. The refractive index change can lead to a formation of polymer optical waveguides. If a monomer that is photo-sensitive is exposed to light (typically UV) under the right conditions, the initial area of polymerization, such as a small circular area, will "trap" the light and guide it to the tip of the polymerized region, further advancing that polymerized region. This process will continue, leading to the formation of a waveguide structure with approximately the same cross-sectional dimensions along its entire length.

According to one embodiment of the present invention, a mask with a two-dimensional pattern of apertures (see FIG. 3) is used to create a three-dimensional polymer microstructure (or an open-cellular polymer micro-truss structure).

Figure 3:
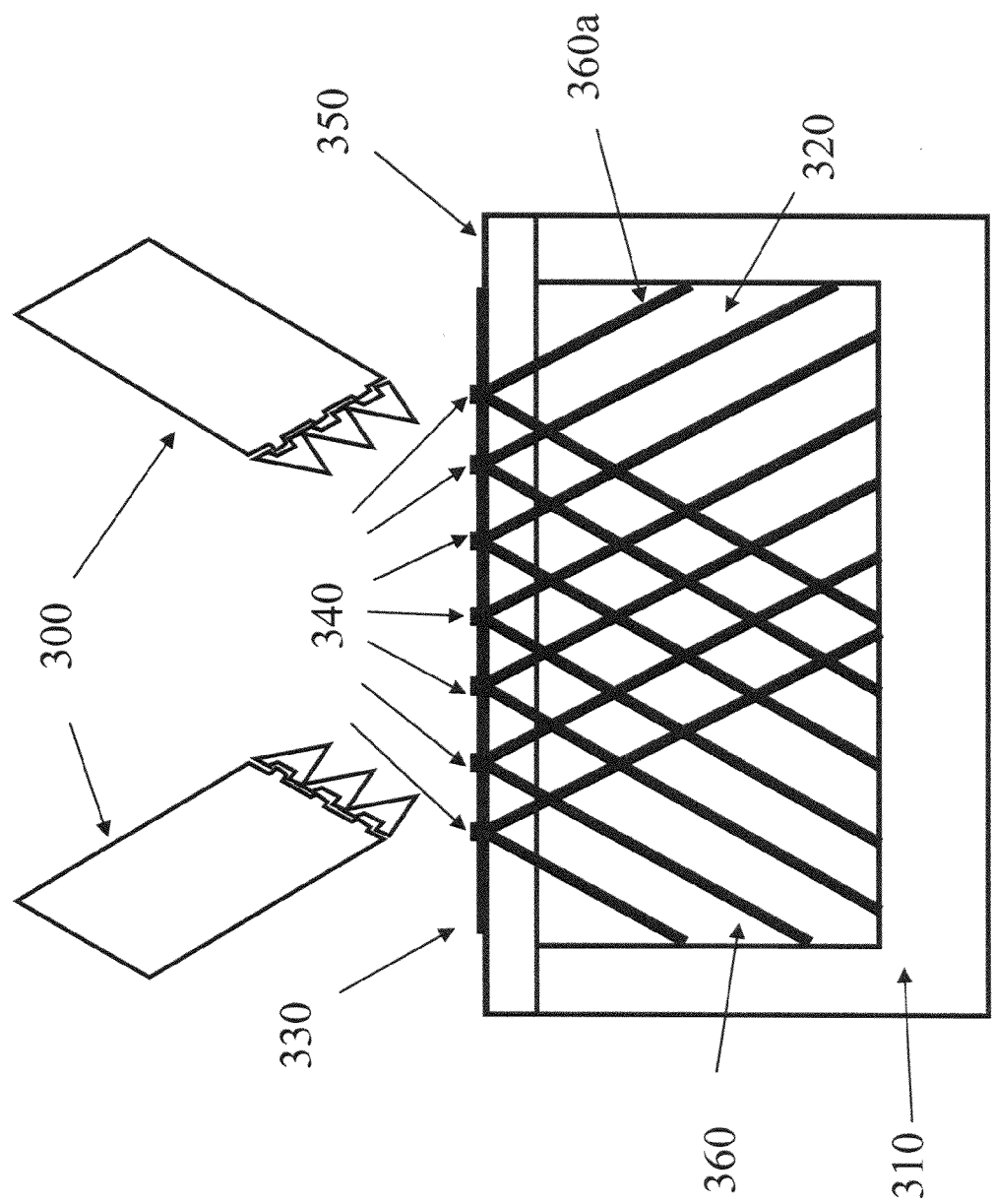
FIG. 3 is a schematic diagram of a system for forming a structure of an embodiment of the present invention from multiple waveguides created using a single collimated beam or multiple collimated beams through multiple apertures.
Figure 4B:
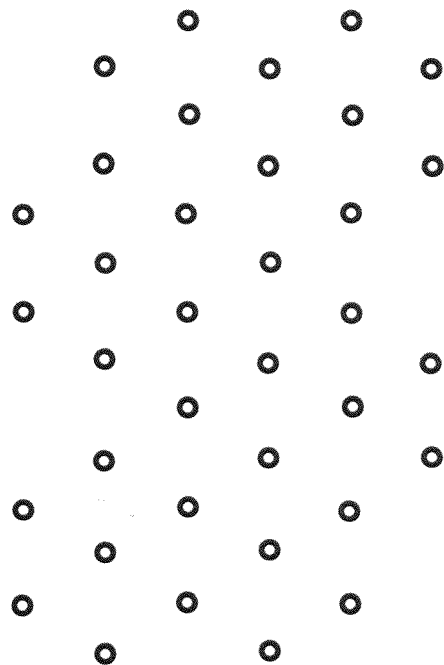
FIG. 4b illustrates an example of a hexagonal mask pattern (or a hexagonal mask aperture pattern) according to embodiments of the present invention.
Figure 4A:
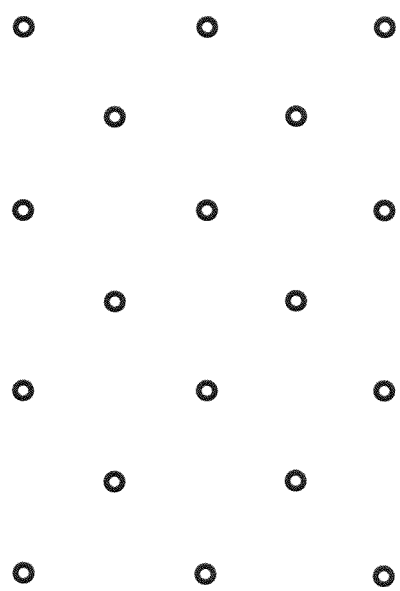
FIG. 4a illustrates an example of a square mask pattern (or a square mask aperture pattern) according to embodiments of the present invention.

With reference to FIG. 3, a system for forming a three-dimensional polymer microstructure according to an embodiment of the present invention includes one or more collimated light sources 300, a reservoir (mold) 310 having a volume of monomer 320 that will polymerize at a wavelength of collimated light beams provided by the light sources 300, and a patterning apparatus, such as a mask 330 with multiple apertures (open areas) 340. Each of the apertures 340 has a given shape and dimension substantially matching a cross-section geometry of a waveguide (e.g., waveguide 360a). Between the mask 330 and the monomer 320, there may be a substrate 350. Here, in FIG. 3, a truly 3D network can be formed because the intersecting polymer waveguides 360 will simply polymerize together, but will not interfere with waveguide propagation. Also, the spacing between the plurality of waveguides 360 corresponds with the pattern of the plurality of apertures 340. The pattern of the apertures 340 may, for example, be in a square pattern as shown in FIG. 4a and/or in a hexagonal pattern as shown in FIG. 4b. The hole (aperture) spacing, i.e., distance between apertures 340 in the mask 330, and the number of waveguides 360 formed from each of the apertures 340 will determine the open volume fraction (i.e. open space) of the formed three-dimensional ordered microstructure (or the formed open-cellular polymer micro-truss structure).

As such, through the system of FIG. 3, a three-dimensional ordered microstructure of an embodiment of the present invention can be designed for a given application. The design parameters include: 1) the angle and pattern of the polymer waveguides with respect to one another, 2) the packing, or relative density of the resulting cellular structure (or the open volume fraction), and 3) the cross-sectional shape and dimensions of the polymer waveguides.

Figure 5:
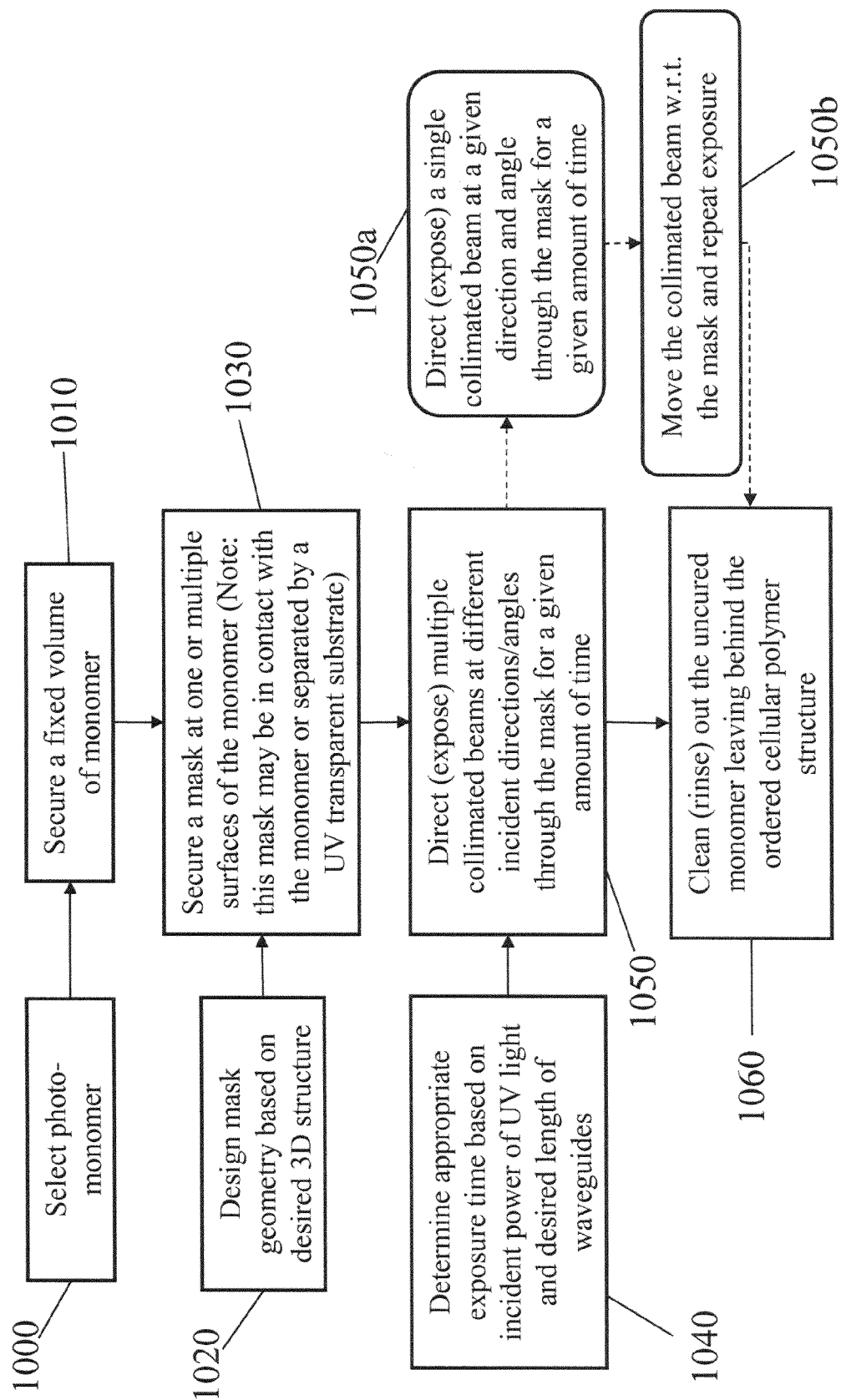
FIG. 5 is a process flow diagram for forming one or more polymer waveguides of a structure according to an embodiment of the present invention.

In more detail, FIG. 5 shows a method of forming a three-dimensional ordered microstructure (or an open-cellular polymer micro-truss structure) according to an embodiment of the present invention. As illustrated in FIG. 5, a photo-monomer is selected in block 1000. In block 1010, a volume of the selected photo-monomer is secured (e.g., in a reservoir). A mask geometry is designed based on a desired three-dimensional structure in block 1020. A patterning apparatus, such as a mask having the designed geometry, is secured in block 1030. Here, the secured mask has at least one aperture between at least one collimated light source and the volume of the selected photo-monomer. In addition, the mask may be in contact with the monomer or separated by a substrate (e.g., by a UV transparent substrate).

In block 1040, an appropriate exposure time is determined based on incident power of a collimated light beam from the at least one collimated light source (e.g., an incident power of a UV light) and a desired length of one or more waveguides. The collimated light beam from the at least one collimated light source is directed to the mask for a period of exposure time so that a portion of the collimated beam passes through the mask and is guided by the at least one aperture into the photo-monomer to form at least one waveguide through a portion of the volume of the photo-monomer. Here, the at least one waveguide has a cross-sectional geometry substantially matching the designed aperture geometry on the mask.

In one embodiment as shown in block 1050, multiple collimated beams at different incident directions and/or angles are directed through the mask for a given amount of time.

Alternatively, as shown in blocks 1050*a*, a single collimated beam at a given direction and angle is directed through the mask for a given amount of time. Then, at block 1050*b*, the collimated light beam is moved with respect to the mask and the exposure is repeated.

Then, at block 1060, any uncured photo-monomer is removed to leave behind a three-dimensional ordered polymer microstructure (or an open-cellular polymer micro-truss structure).

Here, in one embodiment, the plurality of polymer waveguides are used to form the three-dimensional ordered polymer microstructure, and the three-dimensional ordered polymer microstructure corresponds with the pattern of the plurality of apertures.

The resulting three-dimensional polymer microstructure can be formed in seconds in the area where exposed to the incident collimated beam. Since the incident light and the monomer remain fixed with respect to one another during the formation of a polymer waveguide, the exposure area of the collimated beam(s) can be scanned over a larger surface area of monomer, leading to the formation of large-area structures. Alternatively, in one embodiment, a volume of monomer can continuously be fed under a fixed incident light pattern (created from a mask and collimated light) leading to a path for mass production.

As described, once the polymer cellular structure is formed in the volume of monomer, the remaining un-polymerized material (monomer) is removed leaving an open cellular polymer material that is the three-dimensional ordered microstructure (or the open-cellular polymer micro-truss structure). By way of example, a solvent that dissolves the monomer (but not the polymer) may be used to aid in the monomer removal.

With reference back to FIGS. 1 and 2, the truss elements 12, 14, 16 of the microstructure 10 define an open volume (i.e. free space) of the microstructure 10. In one embodiment, the microstructure 10 defines a free space of not less than about 40% by volume and not greater than about 99% by volume. In another embodiment, the microstructure 10 defines a free space of not less than about 70% by volume and not greater than about 95% by volume.

The truss elements 12, 14, 16 intersect at the nodes 18 to form symmetrical angles in three-dimensions (three orthogonal directions). The symmetrical angles relative to the xz-plane (see, FIG. 1), can measure between 0° and 90°. That is, truss elements 12, 14, 16 interpenetrate each other to form "perfect" nodes: each of the truss elements 12, 14, 16 defines an angle relative to a compression surface of the microstructure 10 (e.g. a surface extending along a direction of the xz-plane), and the respective angles defined by the truss elements 12, 14, 16 are substantially equal to one another. However, embodiments of the present invention are not limited thereto.

The truss elements 12, 14, 16 have an intrinsically high strength due to their small scale. In one embodiment, each of the truss elements 12, 14, 16 has a diameter of not greater than about 500 µm.

In another embodiment, each of the truss elements 12, 14, 16 has a diameter of not greater than about 200 µm. In another embodiment, each of the truss elements 12, 14, 16 has a diameter of not greater than about 1 µm. The truss elements 12, 14, 16 are configured to have a correspondingly small aspect ratio (e.g., length/diameter ratio) for withstanding a bending moment. Here, each of the truss elements 12, 14, 16 has a length not greater than 100 µm such that the truss elements can better withstand a mechanical load applied to the microstructure 10. As such, the truss elements 12, 14, 16 experience little, if any, bending deformation during application of the mechanical load to the microstructure 10.

At certain size scales (e.g., the size scales described above), the strength of the truss elements is increased, which corresponds to an increased strength of the microstructure 10. In one embodiment, each of the truss elements 12, 14, 16 has molecular alignment extending along an axial direction of the truss element. As such, an anisotropic material is produced, which provides a substantial degree of stiffness and/or strength along the axial direction. In one embodiment, in a material that is composed of long molecular chains (e.g., polymers), the molecules thereof can be aligned along a direction to provide an increased degree of mechanical strength and/or stiffness along the alignment direction. In more detail, where the molecular alignments of the truss elements 12, 14, 16 extend along the corresponding axial directions, the truss elements 12, 14, 16 are configured to axially transfer a mechanical load applied to the microstructure 10.

As described above, the microstructure 10 withstands the mechanical load, e.g., via axial tension and compression of the truss elements 12, 14, 16. Molecular alignment of the truss elements 12, 14, 16 along their respective axial directions lends additional strength and/or stiffness to the truss elements 12, 14, 16 and, accordingly, also to the microstructure 10.

In one embodiment, the truss elements 12, 14, 16 are configured to provide the microstructure 10 with an axial-dominated deformation behavior of the truss members under a compression load applied to the microstructure 10. Such axial-dominated behavior is contrasted from the bending-dominated behavior (e.g. of randomly oriented cellular structures), as described in Ashby, "The Properties Of Foam And Lattices," Philosophical Transactions—Royal Society Of London Series A Mathematical Physical And Engineering Sciences, Vol. 364, 2006, which is incorporated by reference herein in its entirety.

In a bending-dominated structure, the elastic modulus is proportional to the square of the relative density $\Box/\Box_s'$, where $\Box$ is the density of the cellular material and $\Box_s'$ is the density of the solid from which it is constructed. In contrast, a compression dominated structure (such as microstructure 10), has a compressive elastic modulus (E) directly proportional to both the relative density thereof and the modulus ($E_s$) of the solid material portion of the microstructure 10, as expressed in the equation (1) below:

$$E = E_s(\sin^4\theta)(\rho/\rho_s) \qquad (1)$$

where $\rho$ is a density of the microstructure 10, $\rho_s$ is a density of a solid material portion of the microstructure 10, $\theta$ is an angle of at least one of the truss elements 12, 14, 16 relative to a compression surface of the microstructure 10, and $E_s$ is a modulus of the solid material portion of the microstructure 10. As such, the elastic modulus of a structure of embodiments of the present invention is also proportional to a geometric function of the angle θ of the structure, and θ can accordingly be chosen to vary (e.g., increase or reduce) the elastic modulus.

Figure 6:
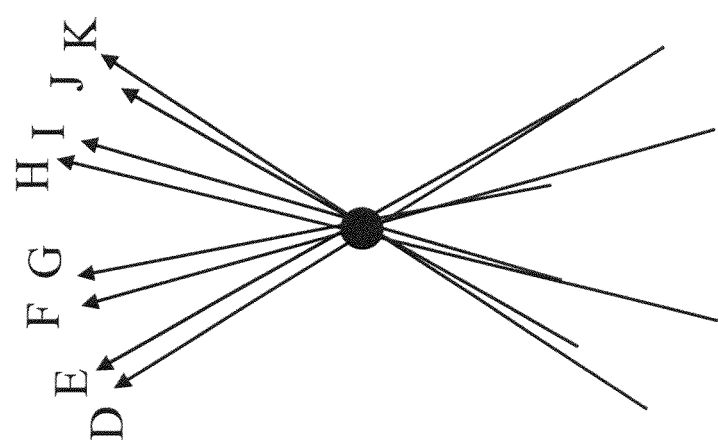
FIG. 6 is a perspective schematic view showing respective directions along which truss elements of a structure of an embodiment of the present invention extend.

With reference back to FIGS. 1 and 2, the microstructure 10 includes truss elements 12, 14, 16 respectively extending along A, B, and C directions. However, embodiments of the present invention are not limited thereto. For example, with reference to FIG. 6, a structure of an embodiment of the present invention may include truss elements defined by self-propagating polymer waveguides and extending along D, E, F, G, H, I, J and K directions, respectively. For example, a structure according to an embodiment of the present invention may include eight truss elements, each of which extends along a corresponding one of eight varying directions. Here, similar to the embodiment shown in FIGS. 1 and 2, the eight truss elements interpenetrate each to form nodes of a continuous material with a three-dimensional microstructure order. However, embodiments of the present invention are not limited thereto, and may include more or fewer than eight truss elements.

In a further embodiment of the present invention, the open volume of a cellular structure is filled at least partially with a material different from the material of the cellular structure itself, thereby creating an ordered bi-phase composite. This material filling the open volume micro-truss structure may be an ordered micro-truss material of different size scales or a random cellular material, such as a foam. Also in a further embodiment of the present invention, one or more truss elements of a cellular structure are coated with a ductile material to improve the energy absorbing properties and to reduce the brittleness of the micro-truss structure. Also in a further embodiment of the present invention, base elements of a cellular structure are coated with a material different from the material of the cellular structural itself, and the base elements are removed to create a self-supporting structure having continuous but separated volumes.

An embodiment of the present invention creates a micro-truss based material for blast protection. Here, in one embodiment, the material serves as a lightweight structural element and porous energy absorption layer in a designed blast protection apparatus (or system). The micro-truss material can be used as the core in a sandwich structure.

Figure 7A:
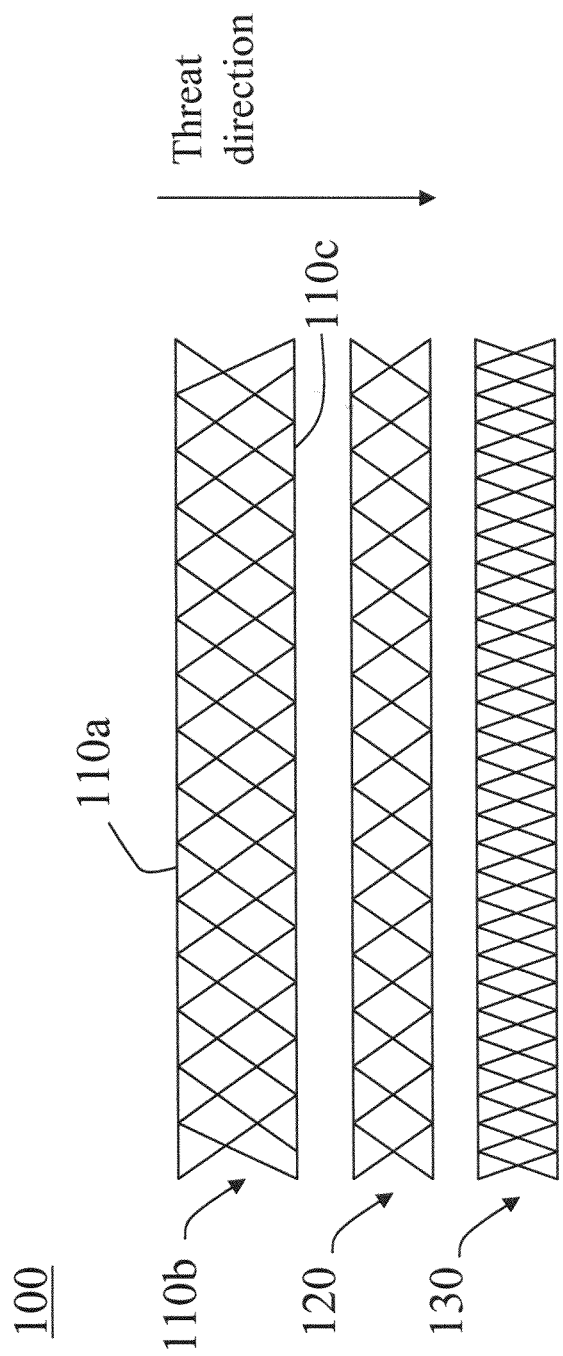
FIG. 7a is a schematic view showing a complete blast protection apparatus (or system) according to an embodiment of the present invention.

Referring to FIG. 7a, in embodiments of the present invention, a complete blast protection apparatus (or system) 100 can be composed of a single cellular (porous) layer (or core) 110b sandwiched between solid faceplates (or facesheets) 110a, 110c, or multiple porous layers 110b, 120, 130 between multiple faceplates (or facesheets), as shown in FIG. 7a. The cellular layer 110b, 120, 130 and solid faceplates 110a, 110c may be made of the same or dissimilar materials. Here, the truss microstructure provides mechanical benefits over random cellular foams, which have similar (or substantially the same) feature size length scales, and the porous nature of the material according to one embodiment of the present invention enables energy to be absorbed from the impact of an object or pressure wave generated from a blast.

In more detail, FIG. 7a is a schematic showing a multilayer sandwich of microtruss core 110b, 120, 130, in which each core layer 110b, 120, 130 can either be identical or different (shown). In addition, each core layer 110b, 120, and 130 can be designed with different length scales and growth geometries to help maximize (or increase) performance against any particular blast threat.

Specifically, an embodiment of the present invention provides a method of absorbing an energy. Here, the method includes: positioning a first three-dimensional ordered truss core between a first face plate and a second face plate, the first three-dimensional ordered truss core including: a plurality of first truss elements defined by a plurality of first self-propagating polymer waveguides and extending along a first direction; a plurality of second truss elements defined by a plurality of second self-propagating polymer waveguides and extending along a second direction; and a plurality of third truss elements defined by a plurality of third self-propagating polymer waveguides and extending along a third direction, wherein the first, second, and third truss elements interpenetrate each other at a plurality of first nodes to form a first continuous material, and wherein the first, second, and third truss elements define a first open space; positioning at least one of the first face plate or the second face plate to allow the energy to impact the at least one of the first face plate or the second face plate; and absorbing the energy by densifying the first three-dimensional ordered truss core through collapsing of the first open space.

In one embodiment, the method further includes: positioning the second plate between the first three-dimensional ordered truss core and a second three-dimensional ordered truss core, the second three-dimensional ordered truss core including: a plurality of fourth truss elements defined by a plurality of fourth self-propagating polymer waveguides and extending along a fourth direction; a plurality of fifth truss elements defined by a plurality of fifth self-propagating polymer waveguides and extending along a fifth direction; and a plurality of sixth truss elements defined by a plurality of sixth self-propagating polymer waveguides and extending along a sixth direction, wherein the fourth, fifth, and sixth truss elements interpenetrate each other at a plurality of second nodes to form a second continuous material, and wherein the fourth, fifth, and sixth truss elements define a second open space; and further absorbing the impact energy by densifying the second three-dimensional ordered truss core through collapsing of the second open space. In addition, the method may further include: positioning the second three-dimensional ordered truss core between the second face plate and a third three-dimensional ordered truss core, the third three-dimensional ordered truss core including: a plurality of seventh truss elements defined by a plurality of seventh self-propagating polymer waveguides and extending along a seventh direction; a plurality of eighth truss elements defined by a plurality of eighth self-propagating polymer waveguides and extending along an eighth direction; and a plurality of ninth truss elements defined by a plurality of ninth self-propagating polymer waveguides and extending along a ninth direction, wherein the seventh, eighth, and ninth truss elements interpenetrate each other at a plurality of third nodes to form a third continuous material, and wherein the seventh, eighth, and ninth truss elements define a third open space; and further absorbing the impact energy by densifying the third three-dimensional ordered truss core through collapsing of the third open space.

In one embodiment, each of the first, second, and third truss elements has a truss diameter between about 10 microns and about 5 mm and has a length between two adjacent ones of the nodes that is between about 5 and 15 times the truss diameter. Also, the first three-dimensional ordered truss core may have between about ½ unit cell of the three-dimensional ordered truss core and about 5 unit cells of the three-dimensional ordered truss core through its thickness.

As such and in view of the foregoing, an embodiment of the present invention enable controlled densification or densification according to a design. That is, by utilizing the three-dimensional order truss core (the microtruss), in some cases in multiple layers, embodiments of the present invention are designed as structures that absorb energies of impacts at set or predetermined stress levels.

Figure 7B:
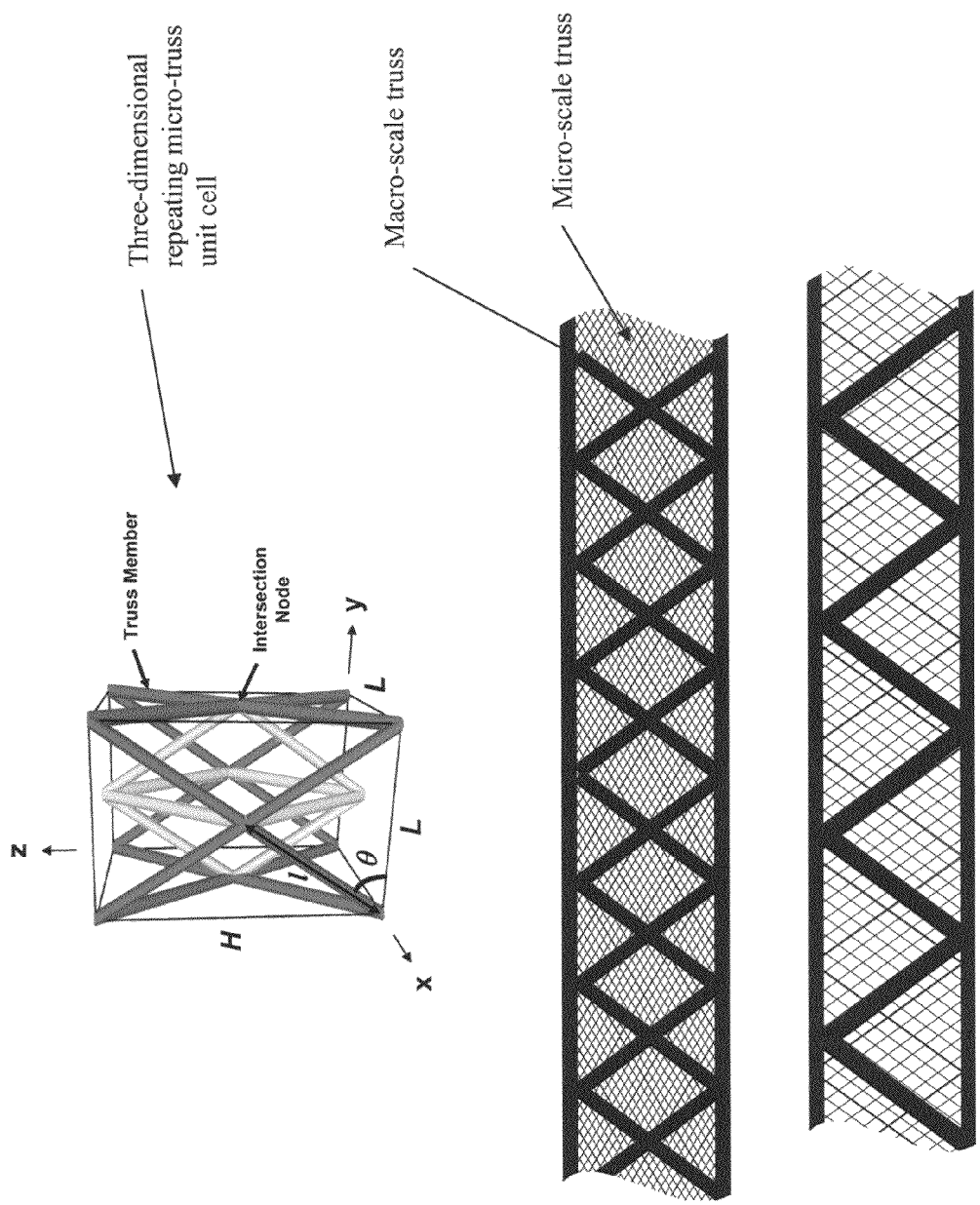
FIG. 7b illustrates a configuration of micro- and macro-scale truss according to another embodiment of the present invention.
Figure 7D:
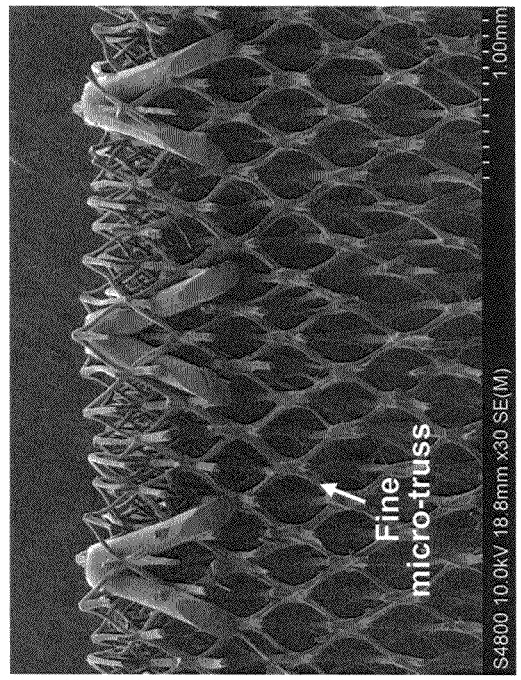
FIGS. 7c and 7d are SEM images of concept of the embodiment shown in FIG. 7b.
Figure 7C:
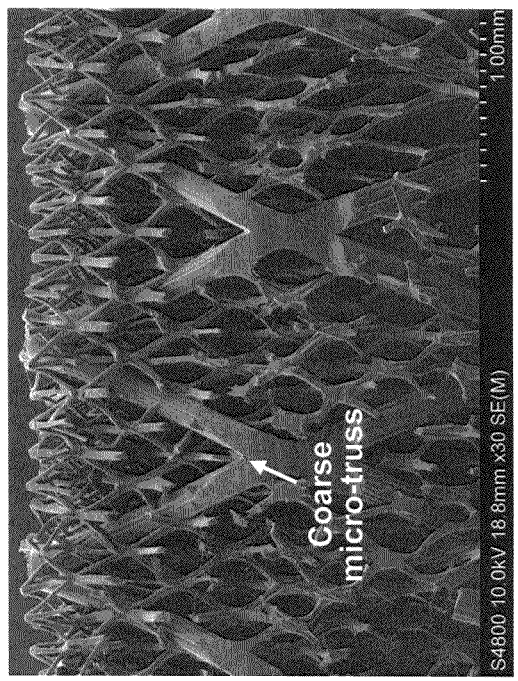

Referring to FIGS. 7b, 7c and 7d, in other embodiments of the present invention, hierarchical structures are utilized for absorbing impact energy. One type of hierarchical structure has a smaller scale micro-truss filling the open volume of a larger-scale micro-truss. That is, FIG. 7b illustrates a configuration of micro- and macro-scale truss according to another embodiment of the present invention in which a micro-truss based structural apparatus intended to absorb energy from an impact includes a hierarchical structure. The hierarchical structure includes a smaller scale micro-truss filling the open volume of a larger-scale micro-truss, the smaller scale micro-truss being defined by a plurality of first self-propagating photopolymer waveguides and the larger scale micro-truss being defined by a plurality of second self-propagating photopolymer waveguides.

FIGS. 7c and 7d are SEM images of the concept described above and shown in FIG. 7b.

Figure 8A:
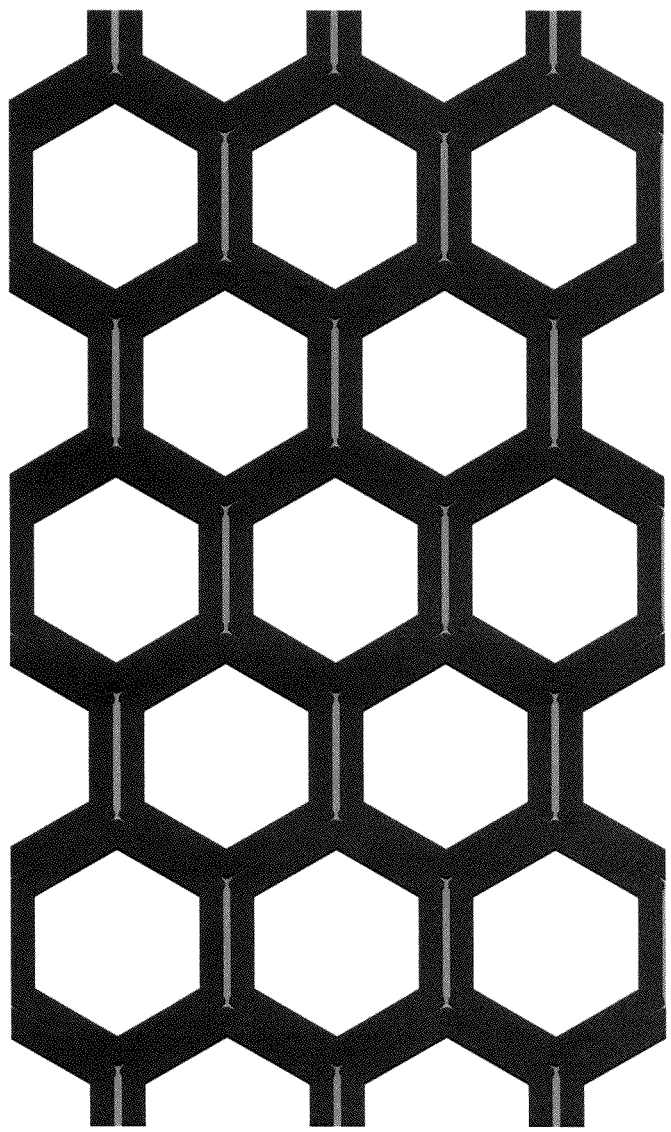
FIG. 8a is a top schematic view of a hierarchical structure for blast protection according to an embodiment of the present invention.
Figure 8B:
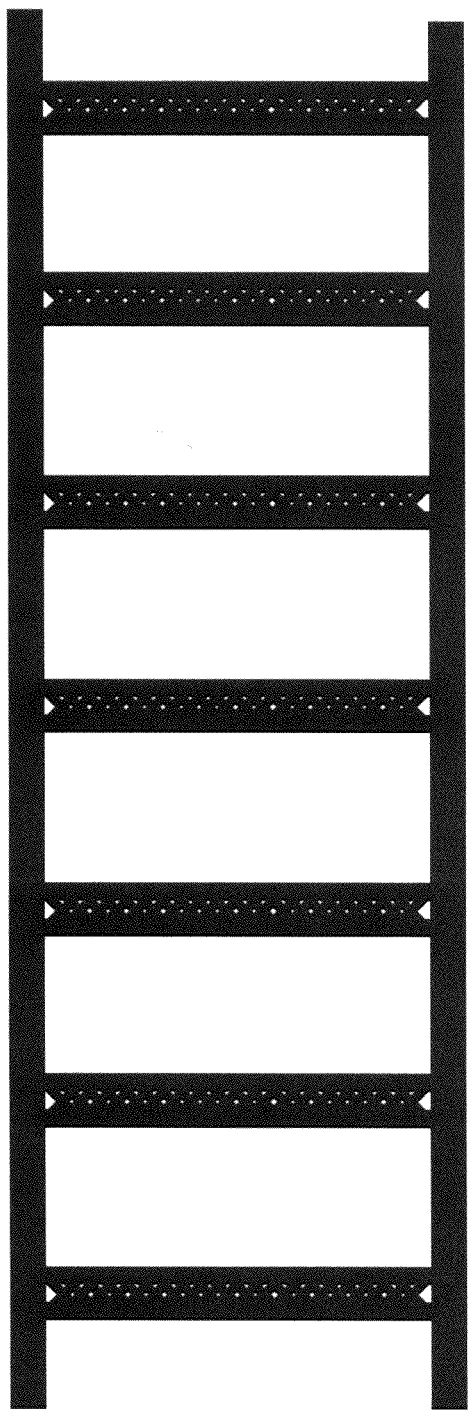
Figure 9:
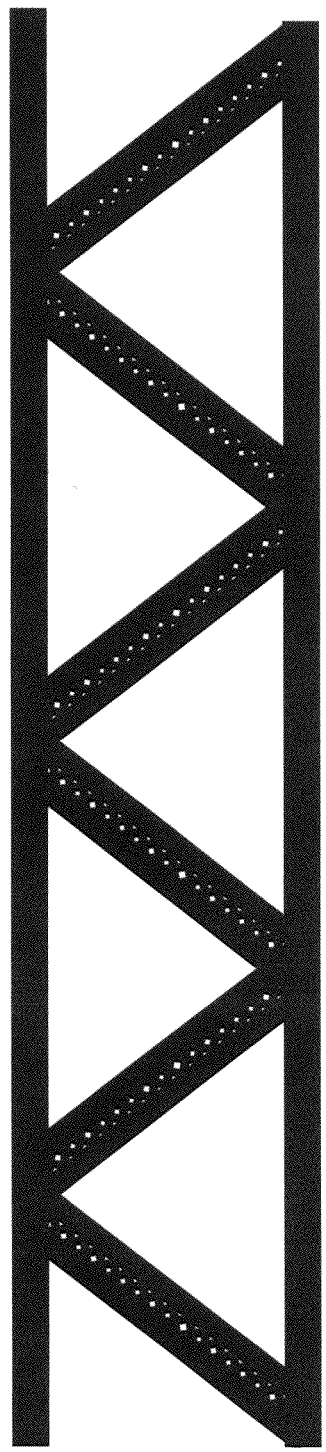
FIG. 9 is a side schematic view of a hierarchical structure for blast protection according to another embodiment of the present invention.

Referring to FIGS. 8a, 8b, and 9, in other embodiments of hierarchical structures include "trusses of trusses" where macro-scale truss materials are replaced by cellular truss-like structures at a smaller size scale. Two examples of this type of two-level hierarchical structure are given in FIGS. 8a, 8b, and 9, but the present invention is not thereby limited. Such hierarchical structures are generally lighter weight for the same structural stiffness, and the use of several extra levels of hierarchy encourage particular deformation modes during impact.

In more detail, FIG. 8a is a top view of a hierarchical structure for blast protection according to an embodiment of the present invention, and FIG. 8b is a side view of the hierarchical structure shown in FIG. 8a. Here, in FIGS. 8a and 8b, the hierarchical structure is composed of one or more hexagonal cores where the walls are made of sandwich structures.

FIG. 9 shows a hierarchical structure for blast protection according to another embodiment of the present invention. Here, the hierarchical structure shown in FIG. 9 is composed of repeating "V" like structures (or V-shaped structures) forming a large truss core (or macro-scale truss core) sandwiched between two faceplates (facesheets).

Figure 10:
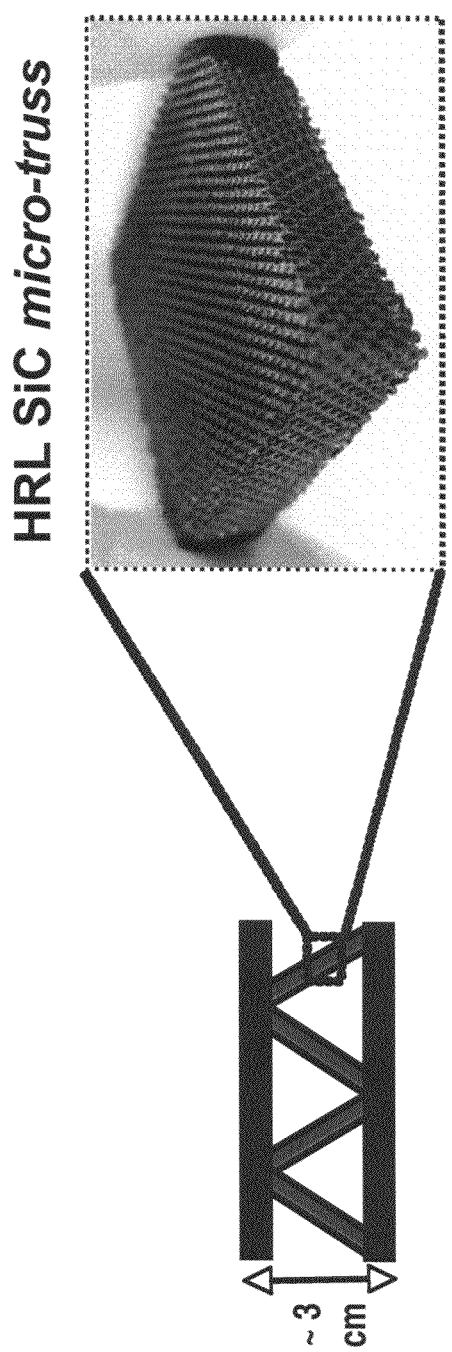
FIG. 10 is a schematic view showing a large truss core (or macro-scale truss core) of a hierarchical structure for blast protection according to an embodiment of the present invention in which the macro-scale truss core is itself composed of micro-scale truss materials.

In one embodiment, as shown in FIG. 10, the large truss core (or macro-scale truss core) of FIG. 9 is itself composed of micro-scale truss materials. That is, as shown in FIG. 10, this hierarchical structure for blast protection utilizes micro-scale truss materials that incorporates two levels of hierarchy, one level being the truss structure of the large truss core and the other level being the micro-scale truss materials.

Figure 11:
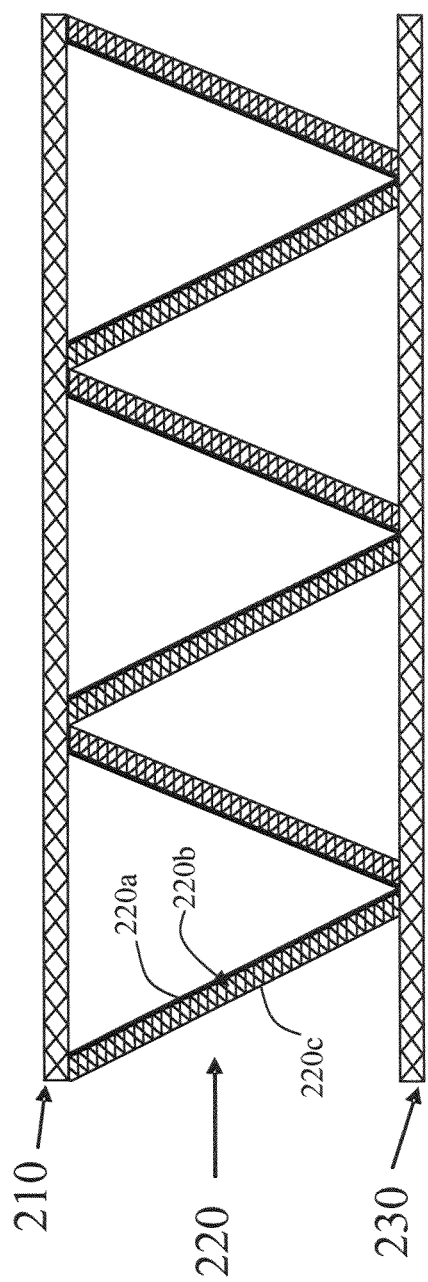
FIG. 11 is a schematic view of a micro-truss based structural apparatus intended to absorb energy from an impact or pressure wave according to another embodiment of the present invention that includes a micro-scale truss hierarchical structure and a macro-scale truss hierarchical structure composed of the micro-scale truss hierarchical structure.

In more detail, referring to FIG. 11, a micro-truss based blast protection apparatus according to an embodiment of the present invention includes a micro-scale truss hierarchical structure and a macro-scale truss hierarchical structure composed of the micro-scale truss hierarchical structure. In one embodiment, the macro-scale truss hierarchical structure includes a plurality of macro-scale truss elements 220. The micro-scale truss hierarchical structure includes a plurality of micro-scale truss elements 220b, and the plurality of macro-scale truss elements 220 are composed of the plurality of micro-scale truss elements 220b. The plurality of micro-scale truss elements 220b of the micro-scale truss hierarchical structure include a plurality of first truss elements defined by a plurality of first self-propagating polymer waveguides and extending along a first direction, a plurality of second truss elements defined by a plurality of second self-propagating polymer waveguides and extending along a second direction, and a plurality of third truss elements defined by a plurality of third self-propagating polymer waveguides and extending along a third direction. The first, second, and third truss elements interpenetrate each other at a plurality of nodes to form a continuous material. The first, second, and third truss elements define an open space for providing a densification in response to an impact, and the micro-scale truss hierarchical structure is self-supporting (e.g., see FIG. 10). Here, in one embodiment, the truss diameter can range from 10 microns to 5 mm depending on the design criteria. The length of the truss member between nodes can be between 5 and 15 times the diameter. In addition, the number of nodes, or the number of repeating unit cells, through the thickness can be designed. Typical micro-truss structures can have ½ unit cell to 5 unit cells through the thickness. Macro-truss structures can have size scales of about 2 to 20 times that of the microtruss structure.

In one embodiment, the plurality of macro-scale truss elements 220 of the macro-scale truss hierarchical structure define a second open space for providing a second densification in response to an impact.

In one embodiment, the micro-truss based blast protection apparatus also includes a first face plate 220a and a second face plate 220c, and the plurality of micro-scale truss elements 220b of the micro-scale truss hierarchical structure are between the first face plate 220a and the second face plate 220c.

In one embodiment, the plurality of macro-scale truss elements 220b are configured to be a plurality of V-shaped structures as shown in FIG. 11. However, the present invention is not thereby limited. For example, in another embodiment of the present invention, as shown in FIGS. 8a and 8b, the plurality of macro-scale truss elements are configured to be a plurality of hexagonal cores.

Referring back to FIG. 11, in one embodiment, the micro-truss based blast protection apparatus further includes a third face plate 210 and a fourth face plate 230. Here, the V-shaped structures formed by the macro-scale truss elements 220b are between the third face plate 210 and the fourth face plate 230.

In one embodiment, the open volume of the micro-truss is filled with a random cell foam, where the average cell size of the foam is substantially smaller than the cell size of the micro-truss material, as shown in FIG. 13

Mechanical Enhancements Using Micro-Truss Materials as Porous Layer in Sandwich Structure A micro-truss based protection apparatus according to an embodiment of the present invention that utilizes micro-truss materials as a porous layer (or core) in a sandwich structure can achieve certain mechanical enhancements as described in more detail below.

Porous, or cellular, materials are desired for weight-critical and multifunctional structural applications because of their low density and open volume. However, the mechanical properties of a cellular material, such as the strength and elastic modulus, are significantly diminished in comparison to their solid counterparts. The two most important factors that influence the mechanical properties of a cellular material are its relative density (which is the ratio of the cellular material density ($\rho$) to the density of the parent solid ($\rho s$)), and its cellular structure. A study of the prior patent disclosures described above in the background section—has shown that randomly oriented cellular materials, such as foams, exhibit bending-dominated behavior of the cell struts under applied mechanical load. Simple mechanics dictate that this "soft" mode of deformation is less efficient in load carrying capacity than stretch/compress-dominated (axial-dominated) behavior, as exemplified in conventional, large-scale truss structures, such as building frames and bridges. By designing the microstructure of a cellular material to resemble these truss structures, it is possible to change the mode of deformation of the cell struts (or truss members) from bending-dominated to stretch or compress-dominated.

That is, in more detail, the elastic modulus E of a bulk cellular material can be approximated by the following equation (2):

$$E = C_E E_S (\rho/\rho_s)^r \quad (2)$$

where $E_s$ is the elastic modulus of the solid material from which the cellular material is included, and $C_E$ and r are scaling parameters related to the cellular structure. This generalized equation is valid for both closed and open cellular materials. The scaling parameter r is a function of how the material deforms during elastic loading. Based on a simple model for random open-cellular structures that exhibit bending-dominated behavior, the study of the prior patent disclosures has shown that the elastic modulus is proportional to the square of the relative density, i.e. r=2. However, the elastic modulus of a cellular material that exhibits stretch/compression-dominated behavior is directly proportional to the relative density (r=1). The scaling parameter $C_E$ is a function of the geometry of the material and how that geometry is oriented in relation to the loading direction. As with the elastic modulus, the strength of a cellular material that exhibits stretch/compression-dominated behavior also scales linearly with relative density. Thus, by designing the microstructure of a cellular material to enable stretch or compress-dominated behavior, a significant increase in modulus and strength can be realized over random cellular architectures.

Materials Selection

One embodiment of the present invention creates a micro-truss based blast protection apparatus as described above by selecting materials for high-strength micro-truss structures based on their feasibility of fabrication. Micro-truss structures with monolithic and composite truss members fabricated from a potential set of materials including vitreous carbon, silicon carbide (SiC), titanium-nitride (TiN), niobium and nickel are desirable. Forms of carbon are particularly desirable including diamond, vitreous carbon, carbon fibers, nanofibers and nanotubes. Higher hardness materials such as tungsten carbide, rhenium diboride, and the like can also be used although they may be considered too dense for some practical implementations.

As an exemplary embodiment, vitreous carbon is selected for utilization in the micro-truss based blast protection apparatus. Here, vitreous carbon is a high-strength, low-density form of carbon. The amorphous structure leads to a random orientation of high-strength carbon-carbon bonds and low density—in comparison to other carbon structures—is a result of nano-pores that form during pyrolization of an appropriate (or suitable) precursor. Compression strengths of up to 580 MPa at a density of ~1.6 g/cm³ have been reported for solid vitreous carbon. The high specific strength of vitreous carbon makes this material a suitable candidate for kinetic energy absorbing materials. Unlike currently available vitreous carbon foams, which have notoriously low strengths, the micro-truss architecture according to embodiments of the present invention will enable a more uniform load distribution within the microstructure, maximizing (or increasing) potential strength. However, the present invention is not limited by the use of vitreous carbon. For example, other ceramic options including SiC or TiN can be utilized in the micro-truss based blast protection apparatus according to embodiments of the present invention.

Also, in one embodiment, if a brittle micro-truss material, such as vitreous carbon, is to absorb energy after initial fracture, it is imperative to avoid catastrophic failure of the structure. As such, in one embodiment, the vitreous carbon (or other ceramic) micro-truss structures are coated with one or more ductile materials to prevent (or protect from) catastrophic failure, and to enable additional absorption of energy through plastic deformation.

In one embodiment, a suitable choice for this ductile material is niobium because it has a relatively high yield strength of about 250 MPa with a maximum elongation of greater than about 30%. Although the density of niobium is relatively high (8.6 g/cm3), its strength and elongation is representative of other engineering metals and hence can be considered a "proxy" for lighter materials with optimal properties. As an alternative to niobium, electro- or electroless plated Ni may be utilized to mitigate any potential processing issues. In one embodiment, a material, such as titanium, is utilized, by coating titanium on the vitreous carbon. Alternatively, as envisioned, the energy absorption materials may also be fabricated from other suitable material sets, including titanium alloys, carbon fibers and diamond.

Based on the material properties given as discussed above, a vitreous carbon micro-truss structure that has a relative density of 0.10 and truss members having an angle with respect to a plate of about 60° (□=60°) would have a theoretically peak strength of 43 MPa and a density of 0.16 g/cm3.

However, in one embodiment of the present invention, a micro-truss based blast protection apparatus composed of vitreous carbon may be very brittle and will not be able to absorb any significant amount of energy after initial fracture. Therefore, as a further enhancement of the micro-truss based blast protection apparatus, a chemical vapor disposition (CVD) coating can be used to reinforce a vitreous carbon micro-truss with a ductile metal, such as niobium, titanium, aluminum, or a number of other suitable metals and metal alloys. In one embodiment, the coating occupies from about 5 to about 15% (or from 5 to 15%) of the solid volume fraction of the micro-truss, thereby significantly increasing its density, but also greatly improving the ability of the micro-truss to absorb energy. Additional improvements in compression strength may be realized through architectural optimization. Architectural optimization refers to trading off unit cell design, truss element diameter, length, angles, number of truss elements per unit cell and materials to achieve a desired densification from an impact or pressure wave.

Impact Energy Absorption

Materials for blast protection should be able to absorb a significant amount of energy when compressed at high rates, generally in the range of 1000 m/s or greater. One approach to absorbing energy from an impact or pressure wave is to design a material system that incorporates a cellular layer that can densify when compressed. The plastic deformation and/or fracture associated with densification of the porous layer from an impact or pressure wave will absorb a significant amount of energy before transferring the impact load to subsequent layers in the material system.

If the material system utilizes a micro-truss structure, rather than a random cellular foam, the increase in peak strength will enable the material system (i.e. sandwich-type structure) to endure a greater impact load before failure. By increasing the failure threshold of the cellular layer, the overall structure can withstand greater impact load before failure. Additionally, a micro-truss structure can achieve the same strength as a random porous structure with a much larger open volume fraction, which not only provides lighter weight but also allows for a greater amount of collapse/densification and therefore greater energy absorption.

Micro-truss structures may be built in layers, each with known, predictable properties. Each layer can be designed to fail at a specific load. Although it is possible to layer foams that fail at different loads (i.e. foams that are different density or made of different materials), it is difficult to design a foam that fails at a desired stress level under compression. The properties of the micro-truss structure can be tailored by changing the truss dimensions, angle, or unit cell geometry.

In addition, the smaller size scale of the truss features also enables multiple nodes to be incorporated between solid facesheet layers, resulting in a more control and/or greater protection against impacts or pressure waves.

In more detail and referring to FIG. 7a, a micro-truss based blast protection apparatus 100 according to an embodiment of the present invention includes a first face plate 110a, a second face plate 110c, and a three-dimensional ordered truss core 110b between the first face plate 110a and the second face plate 110c. Here, the three-dimensional ordered truss core 110b includes a plurality of first truss elements defined by a plurality of first self-propagating polymer waveguides and extending along a first direction, a plurality of second truss elements defined by a plurality of second self-propagating polymer waveguides and extending along a second direction, and a plurality of third truss elements defined by a plurality of third self-propagating polymer waveguides and extending along a third direction. The first, second, and third truss elements interpenetrate each other at a plurality of nodes to form a continuous material. The first, second, and third truss elements define an open space for providing a densification in response to a force applied to at least one of the first face plate 110a or the second face plate 110c, and the three-dimensional ordered truss core 110b is self-supporting.

FIG. 7a shows the orientation of the body impacting the structure 100 as the threat direction. Depending on the design requirements, the large cell structure 110b may be the first to absorb the energy from an impact or the smaller cell structure 130 may be the first to absorb the energy from an impact.

In one embodiment, the micro-truss based blast protection apparatus 100 further includes a second three-dimensional ordered truss core 120. Here, as shown in FIG. 7a, the second plate 110c is between the three-dimensional ordered truss core 110b and the second three-dimensional ordered truss core 120. The second three-dimensional ordered truss core 120 includes a plurality of fourth truss elements defined by a plurality of fourth self-propagating polymer waveguides and extending along a fourth direction, a plurality of fifth truss elements defined by a plurality of fifth self-propagating polymer waveguides and extending along a fifth direction, and a plurality of sixth truss elements defined by a plurality of sixth self-propagating polymer waveguides and extending along a sixth direction. The fourth, fifth, and sixth truss elements interpenetrate each other at a plurality of second nodes to form a second continuous material. The fourth, fifth, and sixth truss elements define a second open space for providing a second densification in response to a force applied thereto, and the second three-dimensional ordered truss core 120 is self-supporting.

In one embodiment as shown in FIG. 7a, the three-dimensional ordered truss core 110b has a first three-dimensional pattern, and the second three-dimensional ordered truss core 120 has a second three-dimensional pattern differing from the first three-dimensional pattern.

In one embodiment, the micro-truss based blast protection apparatus 100 further includes a third three-dimensional ordered truss core. Here, as shown in FIG. 7a, the second three-dimensional ordered truss core 120 is between the second face plate 110c and the third three-dimensional ordered truss core 130. The third three-dimensional ordered truss core 130 includes a plurality of seventh truss elements defined by a plurality of seventh self-propagating polymer waveguides and extending along a seventh direction, a plurality of eighth truss elements defined by a plurality of eighth self-propagating polymer waveguides and extending along an eighth direction, and a plurality of ninth truss elements defined by a plurality of ninth self-propagating polymer waveguides and extending along a ninth direction. The seventh, eighth, and ninth truss elements interpenetrate each other at a plurality of third nodes to form a third continuous material. The seventh, eighth, and ninth truss elements define a third open space for providing a third densification in response to an impact, and the third three-dimensional ordered truss core 130 is self-supporting.

In one embodiment as shown in FIG. 7a, the three-dimensional ordered truss core 110b has a first three-dimensional pattern, the second three-dimensional ordered truss core 120 has a second three-dimensional pattern differing from the first three-dimensional pattern, and the third three-dimensional ordered truss core 130 has a third three-dimensional pattern differing from the first three-dimensional pattern and/or the second three-dimensional pattern.

In one embodiment, the first, second, and third truss elements are adapted to provide the three-dimensional ordered truss core 110b with an axial-dominated behavior of the truss members under a compression force applied to the three-dimensional ordered truss core 110b.

In one embodiment, the first, second, and third truss elements are adapted to provide the three-dimensional ordered truss core 110b with a compressive elastic modulus directly proportional to both a density of the three-dimensional ordered truss core 110b and a modulus of a solid material portion of the three-dimensional ordered truss core 110b.

In one embodiment, the first, second, and third truss elements are adapted to provide the three-dimensional ordered truss core with an elastic modulus in compression (E) determined by equation (3) below:

$$E = C_E E_s (\rho/\rho_s)^r \quad (3)$$

where $\rho$ is a density of the three-dimensional ordered truss core 110b, $\rho_s$ is a density of a solid material portion of the three-dimensional ordered truss core 110b, $E_s$ is a modulus of the solid material portion of the three-dimensional ordered truss core 110b, and $C_E$ and r are scaling parameters related to the three-dimensional ordered truss core 110b (e.g., an angle of at least one of the first, second and third truss elements relative to the at least one of the first face plate 110a or the second face plate 110b as described in equations (1) and (2) above).

In one embodiment, the open space of the three-dimensional ordered truss core 110b is not less than about 40% by volume of the three-dimensional ordered truss core 110b and not greater than about 99% by volume of the three-dimensional ordered truss core 110b.

In one embodiment, the open space of the three-dimensional ordered truss core 110b is not less than about 70% by volume of the three-dimensional ordered truss core 110b and not greater than about 95% by volume of the three-dimensional ordered truss core 110b.

In one embodiment, the three-dimensional ordered truss core 110*b* includes a material selected from the group consisting of vitreous carbon, silicon carbide, titanium-nitride, niobium, nickel, diamond, carbon fibers, nanofibers, nanotubes, tungsten carbide, rhenium diboride, and combinations thereof.

In one embodiment, the three-dimensional ordered truss core 110*b* is a vitreous carbon three-dimensional ordered truss core.

In one embodiment, the micro-truss based blast protection apparatus 100 further includes one or more ductile material layers coated on a surface of at least one truss element of the first truss elements, the second truss elements, or the third truss elements. The one or more ductile material layers may include niobium, titanium, aluminum, and alloys thereof. In addition, the one or more ductile material layers may occupy from about 5 to about 15% of solid volume fraction of the three-dimensional ordered truss core.

In view of the foregoing, aspects of embodiments of the present invention are directed toward micro-truss materials that enable significant advances in lightweight energy absorbing structures. As examples, embodiments of the present invention provide the following innovations:

Relevant size-scale of repeating unit cell: Unit cell features can be quickly fabricated by utilizing a three-dimensional ordered polymer microstructure having a plurality of polymer truss elements defined by a plurality of waveguides as described above. In one embodiment, the truss diameter can range from 10 microns to 5 mm depending on the design criteria. The length of the truss member between nodes can be between 5 and 15 times the diameter. In addition, the number of nodes, or the number of repeating unit cells, through the thickness can be designed. Typical micro-truss structures can have ½ unit cell to 5 unit cells through the thickness. Macro-truss structures can have size scales of about 2 to 20 times that of the microtruss structure.

Architectural flexibility and control: The fabrication process provides control over truss location, density, orientation, and connectivity. As important, this allows the design of controlled, predictable failure modes.

Tailorable micro-truss material options: The polymer micro-truss structures can be converted to vitreous carbon, metals, ceramics, or composites of these materials using established post-processing techniques developed for open-cellular polymer foams.

Multiple symmetric nodes through the thickness of the structure: This improves the node-to-node connectivity and prevents highly localized failure.

Net shape manufacturing: Polymeric starting materials are generally liquid. As such they allow planar and non-planar shapes since the microtruss structure may be fabricated over an irregular surface.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A micro-truss based structural apparatus intended to absorb an impact energy upon impact comprising:
a first face plate;
a second face plate; and
a first three-dimensional ordered truss core between the first face plate and the second face plate, and
wherein the first three-dimensional ordered truss core comprising:
a plurality of first truss elements defined by a plurality of first self-propagating polymer waveguides and extending along a first direction;
a plurality of second truss elements defined by a plurality of second self-propagating polymer waveguides and extending along a second direction; and
a plurality of third truss elements defined by a plurality of third self-propagating polymer waveguides and extending along a third direction;
wherein the first, second, and third truss elements interpenetrate each other at a plurality of first nodes to form a first continuous material;
wherein the first, second, and third truss elements define a first open space enabling densification in response to a force applied to at least one of the first face plate or the second face plate; and
wherein the impact energy is absorbed by the densification of the first three-dimensional ordered truss core.

2. The micro-truss based structural apparatus intended to absorb energy upon impact of claim 1, further comprising a second three-dimensional ordered truss core,
wherein the second face plate is between the first three-dimensional ordered truss core and the second three-dimensional ordered truss core, and
wherein the second three-dimensional ordered truss core comprises:
a plurality of fourth truss elements defined by a plurality of fourth self-propagating polymer waveguides and extending along a fourth direction;
a plurality of fifth truss elements defined by a plurality of fifth self-propagating polymer waveguides and extending along a fifth direction; and
a plurality of sixth truss elements defined by a plurality of sixth self-propagating polymer waveguides and extending along a sixth direction;
wherein the fourth, fifth, and sixth truss elements interpenetrate each other at a plurality of second nodes to form a second continuous material;
wherein the fourth, fifth, and sixth truss elements define a second open space for enabling densification in response to a force applied thereto; and
wherein the impact energy is further absorbed by densification of the second three-dimensional ordered truss core.

3. The micro-truss based structural apparatus of claim 2, wherein the first three-dimensional ordered truss core has a first three-dimensional pattern, and wherein the second three-dimensional ordered truss core has a second three-dimensional pattern differing from the first three-dimensional pattern.

4. The micro-truss based structural apparatus of claim 2, further comprising a third three-dimensional ordered truss core,
wherein the second three-dimensional ordered truss core is between the second face plate and the third three-dimensional ordered truss core, and
wherein the third three-dimensional ordered truss core comprises:
a plurality of seventh truss elements defined by a plurality of seventh self-propagating polymer waveguides and extending along a seventh direction;
a plurality of eighth truss elements defined by a plurality of eighth self-propagating polymer waveguides and extending along an eighth direction; and a plurality of ninth truss elements defined by a plurality of ninth self-propagating polymer waveguides and extending along a ninth direction;

wherein the seventh, eighth, and ninth truss elements interpenetrate each other at a plurality of third nodes to form a third continuous material;

wherein the seventh, eighth, and ninth truss elements define a third open space for enabling densification in response to a force applied thereto; and wherein the impact energy is further absorbed by densification of the third three-dimensional ordered truss core.

5. The micro-truss based structural apparatus of claim 4, wherein the three-dimensional ordered truss core has a first three-dimensional pattern, wherein the second three-dimensional ordered truss core has a second three-dimensional pattern differing from the first three-dimensional pattern, and wherein the third three-dimensional ordered truss core has a third three-dimensional pattern differing from at least one of the first three-dimensional pattern or the second three-dimensional pattern.

6. The micro-truss based structural apparatus of claim 1, wherein the first, second, and third truss elements are adapted to provide the first three-dimensional ordered truss core with an compression-dominated behavior of the truss elements.

7. The micro-truss based structural apparatus of claim 1, wherein the first, second, and third truss elements are adapted to provide the first three-dimensional ordered truss core with a compressive elastic modulus directly proportional to both a density of the first three-dimensional ordered truss core and a modulus of a solid material portion of the first three-dimensional ordered truss core.

8. The micro-truss based structural apparatus of claim 7, wherein each of the first, second, and third truss elements has a truss diameter between about 10 microns and about 5 mm and has a length between two adjacent ones of the first nodes that is between about 5 and 15 times the truss diameter.

9. The micro-truss based structural apparatus of claim 7, wherein the first three-dimensional ordered truss core has between about ½ unit cell of the first three-dimensional ordered truss core and about 5 unit cells of the first three-dimensional ordered truss core through its thickness.

10. The micro-truss based structural apparatus of claim 7, wherein the first, second, and third truss elements are adapted to provide the first three-dimensional ordered truss core with a compressive elastic modulus (E) determined by:

$$E = C_E E_s (\rho/\rho_s)^r$$

wherein $\rho$ is a density of the first three-dimensional ordered truss core, $\rho_s$ is a density of a solid material portion of the first three-dimensional ordered truss core, $E_s$ is a modulus of the solid material portion of the first three-dimensional ordered truss core, and $C_E$ and $r$ are scaling parameters related to the first three-dimensional ordered truss core.

11. A micro-truss based structural apparatus intended to absorb energy upon impact comprising:

a macro-scale truss structure and a micro-scale truss structure, wherein the macro-scale truss structure comprises a plurality of macro-scale truss elements;

wherein the micro-scale truss structure comprises a plurality of micro-scale truss elements, wherein the plurality of macro-scale truss elements are composed of the plurality of micro-scale truss elements, wherein the plurality of micro-scale truss elements of the micro-scale truss structure comprise:

a plurality of first truss elements defined by a plurality of first self-propagating polymer waveguides and extending along a first direction;

a plurality of second truss elements defined by a plurality of second self-propagating polymer waveguides and extending along a second direction; and a plurality of third truss elements defined by a plurality of third self-propagating polymer waveguides and extending along a third direction;

wherein the first, second, and third truss elements interpenetrate each other at a plurality of nodes to form a continuous material, and wherein the first, second, and third truss elements define an open space enabling densification of the macro-scale truss structure or the micro-scale truss structure.

12. The micro-truss based structural apparatus of claim 11, wherein the plurality of macro-scale truss elements of the macro-scale truss structure define a second open space for enabling a second densification.

13. The micro-truss based structural apparatus of claim 11, further comprising:

a first face plate;

a second face plate;

wherein the plurality of micro-scale truss elements of the micro-scale truss structure are between the first face plate and the second face plate.

14. The micro-truss based structural apparatus of claim 11, wherein the plurality of macro-scale truss elements are configured to be a plurality of hexagonal cores.

15. The micro-truss based structural apparatus of claim 11, wherein the plurality of macro-scale truss elements are configured to be a plurality of V-shaped structures.

16. The micro-truss based structural apparatus of claim 15, further comprising:

a third face plate;

a fourth face plate;

wherein the plurality of V-shaped structures are between the third face plate and the fourth face plate.

17. A micro-truss based structural apparatus to absorb energy of an impact comprising:

a hierarchical structure;

wherein the hierarchical structure comprises a smaller scale micro-truss filling the open volume of a larger-scale micro-truss, the smaller scale micro-truss being defined by a plurality of first self-propagating photopolymer waveguides and the larger scale micro-truss being defined by a plurality of second self-propagating photopolymer waveguides.

18. A method of absorbing an energy, the method comprising:

positioning a first three-dimensional ordered truss core between a first face plate and a second face plate, the first three-dimensional ordered truss core comprising:

a plurality of first truss elements defined by a plurality of first self-propagating polymer waveguides and extending along a first direction;

a plurality of second truss elements defined by a plurality of second self-propagating polymer waveguides and extending along a second direction; and a plurality of third truss elements defined by a plurality of third self-propagating polymer waveguides and extending along a third direction, wherein the first, second, and third truss elements interpenetrate each other at a plurality of first nodes to form a first continuous material, and wherein the first, second, and third truss elements define a first open space;

positioning at least one of the first face plate or the second face plate to allow the energy to impact the at least one of the first face plate or the second face plate; and absorbing the energy by densifying the first three-dimensional ordered truss core through collapsing of the first open space.

19. The method of claim 18, wherein the first, second, and third truss elements are adapted to provide the first three-dimensional ordered truss core with a compressive elastic modulus directly proportional to both a density of the first three-dimensional ordered truss core and a modulus of a solid material portion of the first three-dimensional ordered truss core.

20. The method of claim 19, wherein each of the first, second, and third truss elements has a truss diameter between about 10 microns and about 5 mm and has a length between two adjacent ones of the first nodes that is between about 5 and 15 times the truss diameter.

21. The method of claim 19, wherein the first three-dimensional ordered truss core has between about ½ unit cell of the first three-dimensional ordered truss core and about 5 unit cells of the first three-dimensional ordered truss core through its thickness.

22. The method of claim 19, wherein the first, second, and third truss elements are adapted to provide the first three-dimensional ordered truss core with a compressive elastic modulus (E) determined by:

$$E = C_E E_s (\rho/\rho_s)^r$$

wherein $\rho$ is a density of the first three-dimensional ordered truss core, $\rho_s$ is a density of a solid material portion of the first three-dimensional ordered truss core, $E_s$ is a modulus of the solid material portion of the first three-dimensional ordered truss core, and $C_E$ and $r$ are scaling parameters related to the first three-dimensional ordered truss core.

23. The method of claim 18, further comprising:

positioning the second plate between the first three-dimensional ordered truss core and a second three-dimensional ordered truss core, the second three-dimensional ordered truss core comprising:

a plurality of fourth truss elements defined by a plurality of fourth self-propagating polymer waveguides and extending along a fourth direction;

a plurality of fifth truss elements defined by a plurality of fifth self-propagating polymer waveguides and extending along a fifth direction; and a plurality of sixth truss elements defined by a plurality of sixth self-propagating polymer waveguides and extending along a sixth direction, wherein the fourth, fifth, and sixth truss elements interpenetrate each other at a plurality of second nodes to form a second continuous material, and wherein the fourth, fifth, and sixth truss elements define a second open space; and further absorbing the impact energy by densifying the second three-dimensional ordered truss core through collapsing of the second open space.

24. The method of claim 23, further comprising:

positioning the second three-dimensional ordered truss core between the second face plate and a third three-dimensional ordered truss core, the third three-dimensional ordered truss core comprising:

a plurality of seventh truss elements defined by a plurality of seventh self-propagating polymer waveguides and extending along a seventh direction;

a plurality of eighth truss elements defined by a plurality of eighth self-propagating polymer waveguides and extending along an eighth direction; and a plurality of ninth truss elements defined by a plurality of ninth self-propagating polymer waveguides and extending along a ninth direction, wherein the seventh, eighth, and ninth truss elements interpenetrate each other at a plurality of third nodes to form a third continuous material, and wherein the seventh, eighth, and ninth truss elements define a third open space; and further absorbing the impact energy by densifying the third three-dimensional ordered truss core through collapsing of the third open space.

* * * * *